(12) United States Patent
Yun

(10) Patent No.: US 6,798,036 B2
(45) Date of Patent: Sep. 28, 2004

(54) TEMPERATURE MEASURING METHOD AND APPARATUS IN SEMICONDUCTOR PROCESSING APPARATUS, AND SEMICONDUCTOR PROCESSING METHOD AND APPARATUS

(75) Inventor: Mo Yun, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/431,528

(22) Filed: May 8, 2003

(65) Prior Publication Data

US 2003/0206574 A1 Nov. 6, 2003

Related U.S. Application Data

(62) Division of application No. 09/995,769, filed on Nov. 29, 2001, now Pat. No. 6,579,731.

(30) Foreign Application Priority Data

Dec. 1, 2000 (JP) ........................................ 2000-367071

(51) Int. Cl.[7] ........................ H01L 31/058; H01L 21/66; H01L 21/00; G01K 15/00; G01K 17/00
(52) U.S. Cl. ........................... 257/467; 438/14; 438/54; 374/2; 374/29; 374/120
(58) Field of Search ............................... 438/10; 374/2, 374/29, 120, 43

(56) References Cited

U.S. PATENT DOCUMENTS 6,169,271 B1 * 1/2001 Savas et al. ................. 219/390
6,367,970 B1 * 4/2002 Danielson ..................... 374/43

OTHER PUBLICATIONS

Van Zant, Microchip Fabrication (2000), McGraw–Hill, Fourth Edition, p. 180.*

* cited by examiner

Primary Examiner—Jack Chen
Assistant Examiner—David L. Hogans
(74) Attorney, Agent, or Firm—Finnegan, Henderson, Farabow, Garrett & Dunner, L.L.P.

(57) ABSTRACT

A temperature measuring method for a target substrate to be thermally processed in a semiconductor processing apparatus under a predetermined process condition is provided. This method includes the steps of detecting a heat flux supplied from at least part of the target substrate and detecting a temperature of a sensor by using the sensor facing the target substrate, and calculating a temperature of the target substrate from a parameter, including a thermal resistance between the sensor and the target substrate under the predetermined process condition, the detected heat flux, and the temperature of the sensor. The sensor is arranged opposite to heating means, through the target substrate, which heats the target substrate. The parameter may be obtained in advance by calibration.

4 Claims, 3 Drawing Sheets

TEMPERATURE MEASURING METHOD AND APPARATUS IN SEMICONDUCTOR PROCESSING APPARATUS, AND SEMICONDUCTOR PROCESSING METHOD AND APPARATUS

This is a division of application Ser. No. 09/995,769, filed Nov. 29, 2001 now U.S. Pat. No. 6,578,731, which is incorporated herein by reference.

BACKGROUND OF THE INVENTION

The present invention relates to a temperature measuring method and apparatus in a semiconductor processing apparatus which performs heating and cooling, and a semiconductor processing method and apparatus and, more particularly, to a temperature measuring method and apparatus which are used for an RTP (Rapid Thermal Process) or the like to measure a wafer temperature in-situ, and a semiconductor processing method and apparatus.

Semiconductor integrated circuit manufacturing processes include various types of thermal processes such as a baking process, film forming process, ashing process, and the like in photolithography. Conventionally, in the thermal processes, a halogen lamp arranged to face a target substrate (semiconductor wafer) emits light to heat the target substrate. The temperature of the target substrate is measured in the non-contact manner by using a radiation thermometer arranged opposite to the halogen lamp through the target substrate. The light quantity of the halogen lamp is adjusted on the basis of the measurement result, so the heating temperature of the target substrate is controlled.

Since the radiation thermometer conventionally used for temperature measurement receives energy radiated from the surface from an object with a light-to-energy converting element, it can measure the surface temperature of the object in the non-contact manner. Also, the temperature range where the radiation thermometer is used is as wide as about 100° C. to 3,000° C.

While the radiation thermometer needs the emissivity of the surface of the object for temperature measurement, this emissivity cannot be measured accurately, and the temperature measurement precision is accordingly as low as about 5° C. to 20° C. In particular, when the object is heated or cooled at a high speed, since the emissivity largely depends on the temperature, accurate temperature measurement is difficult to perform.

Also, the emissivity depends on the temperature, the wavelength of light, the type and thickness of the film forming material in CVD (Chemical Vapor Deposition), and the like.

It is also difficult to calibrate the radiation thermometer. A radiation thermometer that measures a temperature while measuring the emissivity is very expensive.

SUMMARY OF THE INVENTION

It is the main object of the present invention to provide a temperature measuring method and apparatus with high measurement precision.

It is another object of the present invention to provide an inexpensive semiconductor processing method and apparatus.

In order to achieve the above objects, a temperature measuring method according to the present invention is a temperature measuring method for a target substrate to be thermally processed in a semiconductor processing apparatus under a predetermined process condition, and includes the steps of detecting a heat flux supplied from at least part of the target substrate to a sensor facing the target substrate and detecting a temperature of the detector, and calculating a temperature of the target substrate from a parameter, including a thermal resistance between the sensor and the target substrate under the predetermined process condition, the detected heat flux, and the temperature of the sensor. The sensor may be arranged opposite to heating means, through the target substrate, which heats the target substrate. The parameter may be obtained in advance by calibration.

A temperature measuring apparatus according to the present invention is a temperature measuring apparatus for a target substrate to be thermally processed in a semiconductor processing apparatus under a predetermined process condition, and comprises heat flux detecting means, having a sensor arranged to face the target substrate, for detecting a heat flux supplied to the sensor from at least part of the target substrate, temperature measuring means for measuring a temperature of the sensor, and calculating means for calculating the temperature of the target substrate from a parameter, including a thermal resistance between the sensor and the target substrate under the predetermined process condition, the detected heat flux, and the temperature of the sensor. The sensor may be arranged opposite to heating means, through the target substrate, which heats the target substrate. The parameter may be obtained in advance by calibration.

A semiconductor processing apparatus according to the present invention comprises heating means for heating a target substrate, temperature measuring means for measuring a temperature of the target substrate to be thermally processed by the heating means, and control means for controlling the heating means on the basis of a measured temperature, to thermally process the target substrate under a predetermined process condition. In this semiconductor processing apparatus, the temperature measuring means is any one of the temperature measuring apparatuses described above. The temperature measuring means also comprise a plurality of temperature measuring means. These temperature measuring means measure temperatures of respective areas of the target substrate divided into a plurality of areas. The control means control the heating means on the basis of the temperatures of the respective areas of the target substrate which are measured by the temperature measuring means. The heating means are controlled to heat one or the plurality of areas of the target substrate divided into the plurality of areas. The semiconductor processing apparatus have storage means for storing, for each of a plurality of different process conditions, a parameter including a thermal resistance between the detector and at least the target substrate under the process condition. The calculating means of the temperature measuring means calculate the temperature of the target substrate for each of the different process conditions on the basis of a parameter corresponding to a current process condition read out from the storage means.

A semiconductor processing method according to the present invention is a semiconductor processing method of thermally processing a target substrate in a semiconductor processing apparatus under a predetermined process condition, including the steps of measuring a temperature of the target substrate to be thermally processed by heating means, and controlling the heating means on the basis of a measured temperature. The step of measuring the temperature of the target substrate includes measuring the temperature of the target substrate in accordance with either one temperature measuring method described above. The detector for detecting the heat flux comprises a plurality of detectors to correspond to respective areas of the target substrate divided into a plurality of areas, and measure temperatures of the respective areas of the target substrate. The step of controlling the heating means comprises controlling the heating means on the basis of the temperatures of the respective areas of the target substrate, thereby heating one or the plurality of areas of the target substrate divided into the plurality of areas. The storage means store, for each of a plurality of different process conditions, a parameter including a thermal resistance between at least the detector and the target substrate under the process condition. The step of measuring the temperature of the target substrate to be thermally processed by the heating means comprises measuring the temperature of the target substrate for each of the different process conditions on the basis of a parameter corresponding to a current process condition read out from the storage means.

With this arrangement, according to the present invention, a heat flux and temperature of one portion are measured, and the temperature of the target substrate is calculated on the basis of them. Accordingly, higher-precision temperature measurement than in the prior art can be performed. No expensive radiation thermometer need be used. As a result, an inexpensive temperature measuring apparatus and a semiconductor processing apparatus using it can be provided.

DESCRIPTION OF THE PREFERRED EMBODIMENTS

The present invention will be described by way of its embodiments.

Figure 1:
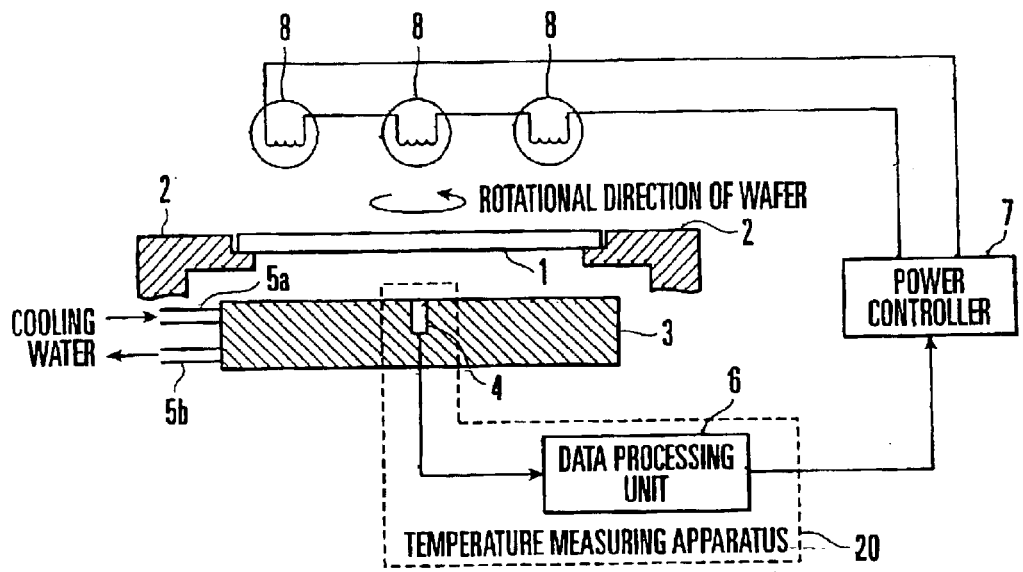
FIG. 1 is a block diagram showing an embodiment of the present invention.

FIG. 1 shows an embodiment of the present invention. As shown in FIG. 1, a wafer 1 as a target substrate is placed on a circular guard ring 2 with an opening at its center. The guard ring 2 can be rotated by a driving means such as a motor (not shown). Hence, when the guard ring 2 is rotated, the wafer 1 can be rotated. A measurement table 3 is arranged under the wafer 1 by about several mm, and a sensor 4 for measuring a heat flux and temperature is buried in it.

Halogen lamps 8 are arranged (in this embodiment, three halogen lamps are arranged in line) to face the wafer 1 and oppose the sensor 4. The halogen lamps 8 emit light to heat the wafer 1.

The light quantities of the halogen lamps 8 are adjusted by a power controller 7. The power controller 7 is feed-back controlled in accordance with an output from a data processing unit 6 which processes an output signal from the sensor 4.

The data processing unit 6 calculates the temperature of the wafer 1 on the basis of the heat flux and temperature (a portion where a heat flux microdetector is set) measured by the sensor 4 in accordance with a calculation method (to be described later). The sensor 4 and data processing unit 6 make up a temperature measuring apparatus 20 for measuring the temperature of the wafer 1.

A cooling circuit (not shown) where cooling water flows is disposed in the measurement table 3. Cooling water entering from an inflow port 5a circulates in the measurement table 3 and is discharged from a discharge port 5b. This cools the measurement table 3, thereby decreasing the temperature of the heated wafer 1.

Figures 2A, 2B:
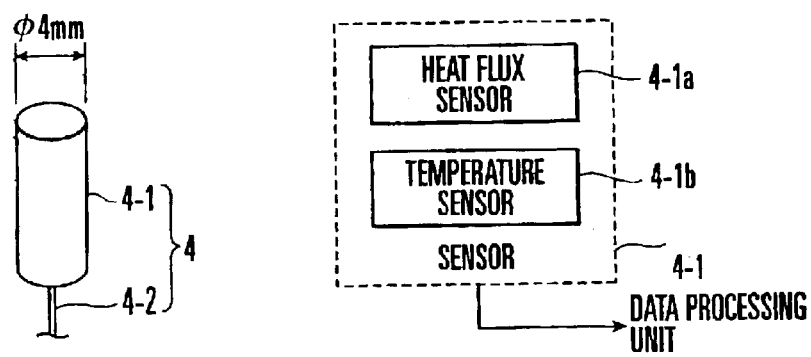
FIGS. 2A and 2B are a perspective view and a block diagram, respectively, showing a heat flux microdetector shown in FIG. 1.

FIGS. 2A and 2B show an example of the sensor 4 that make up part of the temperature measuring apparatus 20. In FIGS. 2A and 2B, the sensor 4 is comprised of a main body 4-1 and a cable 4-2 extending from the main body 4-1. The main body 4-1 has a cylindrical shape with a diameter of about 4 mm, and incorporates a heat flux detector 4-1a and temperature detector 4-1b. Thus, with this sensor 4, both a heat flux and temperature of one portion can be measured.

Figure 3:
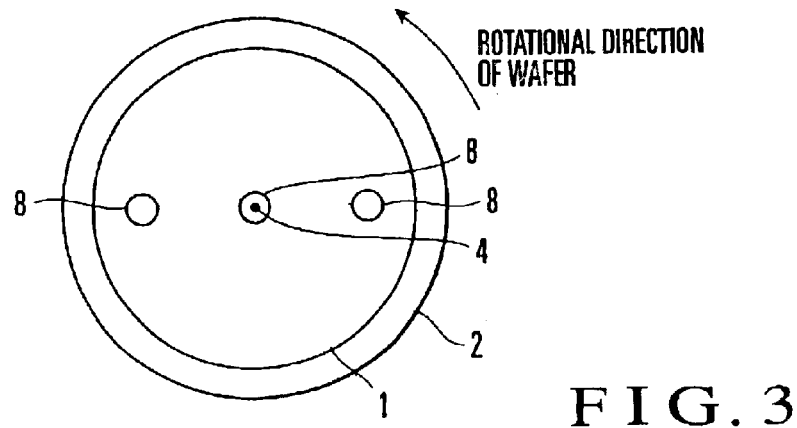
FIG. 3 is a plan view showing the positional relationship among a target substrate, heat flux microdetector, and heater in FIG. 1.

FIG. 3 shows how the apparatus shown in FIG. 1 is seen from above. In FIG. 3, the wafer 1 is placed on the circular guard ring 2, and the three halogen lamps 8 are arranged above the wafer 1. Although the three halogen lamps are used in this embodiment, the number of halogen lamps is not limited to three, and the heating light source is not limited to a halogen lamp. It suffices as far as at least one heating light source is provided.

The sensor 4 is buried in the measurement table 3 immediately under the central one of the three halogen lamps 8. The guard ring 2 can rotate about an axis perpendicular to the wafer 1 as the center. Rotation of the wafer 1 and the control operation of the halogen lamps 8 are performed independently of each other. Thus, the wafer 1 can be arbitrarily heated by the halogen lamps 8 while being rotated. This rotation can uniformly heat the surface of the wafer 1.

The principle with which the temperature of the wafer 1 is calculated from the heat flux measured by the sensor 4 will be explained.

It is conventionally known that the relationship between a heat flux and temperature difference is generally expressed by the following equation:

$$q = (T1 - T2)/R \quad (1)$$

where q is a heat flux (in a direction perpendicular to the measurement surface of the heat flux microsensor 4) between the upper surface of the wafer 1 and the sensor 4, R is a heat resistance (including heat conduction in the wafer, convection, and radiation between the lower surface of the wafer 1 and the measurement table 3) between the upper surface of the wafer 1 and the sensor 4, T2 is the temperature of the upper surface of the sensor 4, and T1 is the temperature of the upper surface of the wafer 1.

When T1 is calculated from equation (1), it yields:

$$T1 = T2 + qR \quad (2)$$

When this equation (2) is used, the wafer temperature T1 can be indirectly obtained from q and T2. Note that q and T2 must be obtained by calibration in advance. For calibration, a calibration wafer with a temperature sensor (e.g., a thermocouple) is used. When the calibration wafer is used, the temperature T1 of the upper surface of the wafer 1 can be directly measured. By using T1, the heat resistance R can be obtained.

A temperature measuring method using the temperature measuring apparatus 20 based on the above principle will be described.

1. Calculation of Heat Resistance R by Calibration

Figure 4:
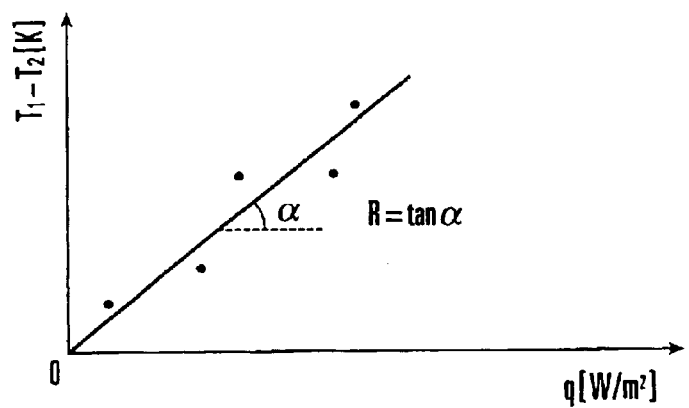
FIG. 4 is a graph showing a measurement result in a steady state.

First, by using the calibration wafer with the temperature detector described above, the temperatures T1 and T2 and heat flux q are measured under the same conditions and with the same arrangement as that of the process in an actual manufacturing line, and are substituted in equation (1), thereby obtaining the heat resistance R. The heat resistance R depends on the emissivity of the lower surface of the safer 1 (in the high-temperature mode), the emissivity of the upper surface of the measurement table 3, the thickness of the wafer 1, the gap between the wafer 1 and measurement table 3, the position of the sensor 4, and the material of the measurement table 3, as well as on the flowing state, pressure, and the type of fluid between the wafer 1 and measurement table 3. When performing calibration, it is done under the same conditions as those of the actual process. More specifically, the temperature is increased or decreased under the same conditions, and the temperatures T1 and T2 and heat flux q are measured. The measurement results are plotted, and are subjected to the method of least squares to obtain a graph (straight line) shown in FIG. 4. Therefore, the heat resistance R under the above conditions is the gradient of the straight line shown in FIG. 4, and is expressed as:

$$R = \tan \alpha \tag{3}$$

where $\alpha$ is the angle formed by the straight line and the q-axis.

2. In-Situ Temperature Measurement

In the actual process, R obtained under the same conditions as those of the above calibration, and the measured T2 and q are substituted in equation (2) to calculate the temperature T1 of the wafer 1. More specifically, the heat resistance R obtained by calibration is stored in the data processing unit 6. An arithmetic process of calculating the temperature T1 from T2 and q, which are measured by the sensor 4, on the basis of equation (2) is performed.

3. Control of Wafer Temperature

FIG. 1 described above shows the ideas of a temperature measurement process and temperature control of the wafer 1. The measurement results of T2 and q are converted into digital signals by the data processing unit 6. Subsequently, the temperature T1 of the wafer 1 is obtained and is compared with a temperature T1' preset in advance by the user. An input voltage to the halogen lamps 8 is controlled by the power controller 7. As a result, the wafer 1 can be heated uniformly.

A CVD apparatus utilizing the above temperature measuring method will be described.

Figure 5:
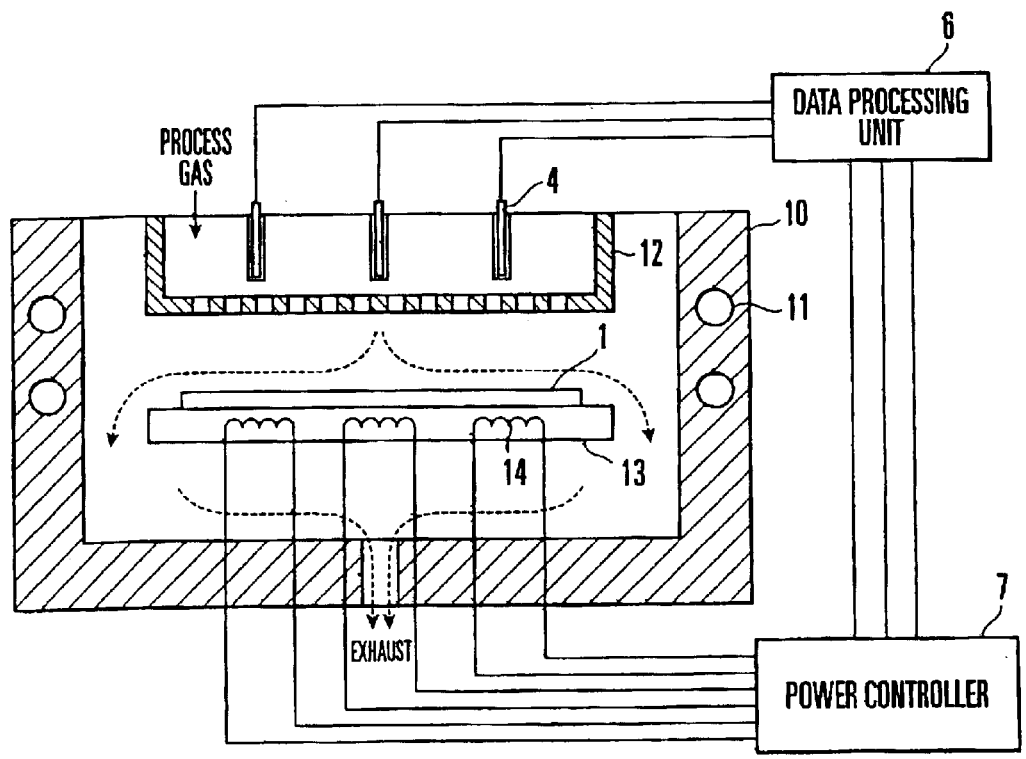
FIG. 5 is a block diagram showing a CVD apparatus.

FIG. 5 shows an example of a CVD apparatus. As shown in FIG. 5, a wafer 1 as a target substrate is placed on a susceptor 13 incorporating a heater 14 made of, e.g., a Nickrome wire. The susceptor 13 (including the wafer 1), a shower head 12, and a sensor 4 are placed in a chamber 10 with a cooling pipe 11. The heater 14 is connected to a power controller 7, and generates heat when power is supplied to it from the power controller 7. The power controller 7 is connected to a data processing unit 6 connected to the sensor 4. The power controller 7 operates under control of the data processing unit 6. The sensor 4 and data processing unit 6 make up a temperature measuring apparatus in the same manner as in FIG. 1.

In this CVD apparatus as well, the temperature of the wafer 1 can be obtained by following the procedures of items 1 to 3 described above. On the basis of the obtained temperature, the heating temperature of the heater 14 can be controlled. In FIG. 5, three sensors are set to respectively face the three heaters. Temperature control may be performed by a multi-point input, multi-point output scheme (to be described later).

Control operation for the planar temperature of the wafer in accordance with the multi-point input, multi-point output scheme will be described.

In FIG. 1, the light quantities of all the halogen lamps 8 are controlled on the basis of the temperature measured by the single sensor 4. Alternatively, the wafer 1 may be divided into a plurality of areas, and the light quantities of the halogen lamps provided for the respective areas may be controlled independently of each other, thereby performing heating.

Figure 6:
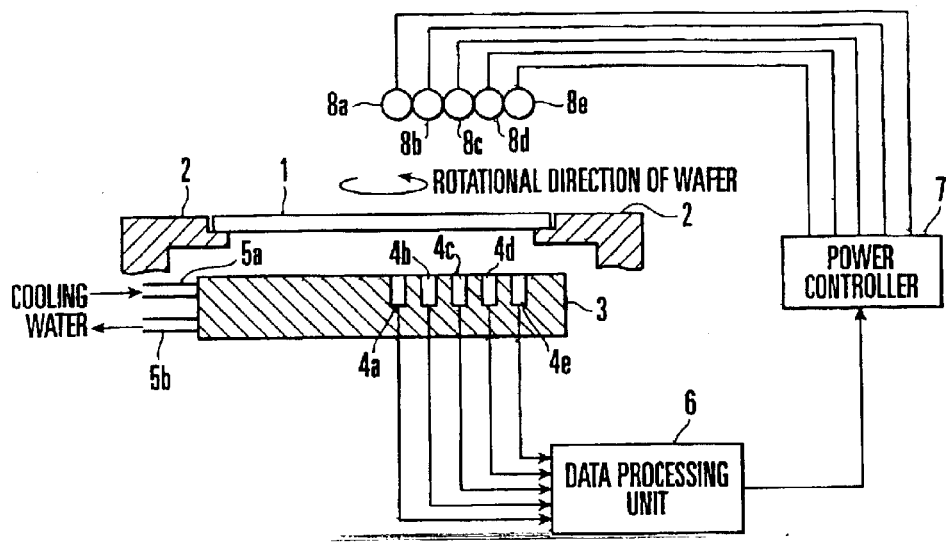
FIG. 6 is a block diagram showing another embodiment of the present invention.

FIG. 6 shows an example of five-point control. Note that the following description also applies to a case using a plurality of sensors other than five sensors. Referring to FIG. 6, the same reference numerals as in FIG. 1 denote the same constituent elements. By using the calibrating scheme and measuring method described with reference to the above equation (2), temperatures $T1^1$, $T1^2$, ..., and $T1^n$ at the respective points of a wafer 1 are measured where superscript 1, 2, ..., n indicate the number of the sensor. Based on the measurement results, the light quantities of halogen lamps 8a to 8e are adjusted by a power controller 7, to feed-back control the temperatures of the areas corresponding to the respective halogen lamps.

Figure 7:
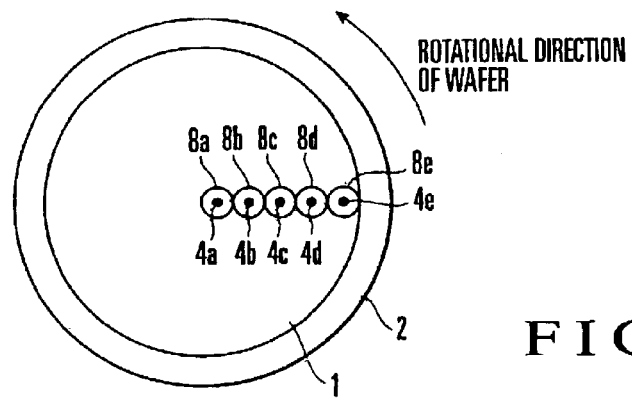
FIG. 7 is a plan view showing the positional relationship among a target substrate, heat flux microdetector, and heater in FIG. 5.

FIG. 7 shows how the apparatus shown in FIG. 6 is seen from above. As shown in FIG. 7, the wafer 1 is placed on a circular guard ring 2, and the halogen lamps 8a to 8e are arranged above the wafer 1. Sensors 4a to 4e are buried in a measurement table 3 immediately under the halogen lamps 8a to 8e. The guard ring 2 can rotate about an axis perpendicular to the wafer 1 as the center. Rotation of the wafer 1 and the control operation of the halogen lamps 8 are performed independently of each other. Thus, the wafer 1 can be arbitrarily heated by the halogen lamps 8 while being rotated. This rotation can uniformly heat the wafer 1.

A method of measuring the temperature of a processing surface in an unsteady state will be described.

The relationship among temperatures T1 and T2 and a heat flux q in the unsteady state can be approximated by the following equation:

$$T1 - T2 = qR + fv \tag{4}$$

where v is a temperature rise/drop rate, and f is a correction coefficient which is expressed by the following equation:

$$f = f(v, R, Cp, \rho, \ldots) \tag{5}$$

Figure 8:
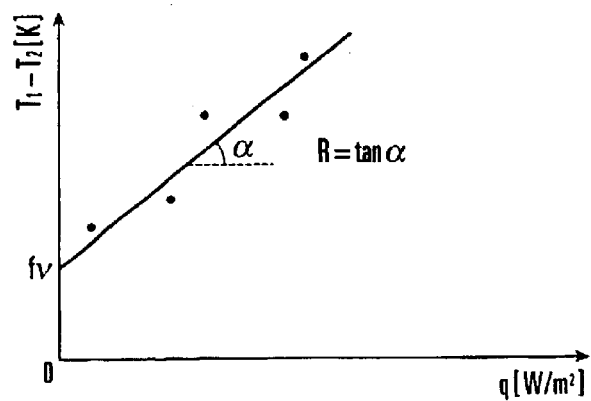
FIG. 8 is a graph showing a measurement result in an unsteady state.

Also, Cp is the specific heat of the wafer 1 and measurement table 3, $\rho$ is the density, and f and R are obtained by a calibration process. As shown in FIG. 8, f and R are obtained by the calibration procedure of the steady state described above. In this manner, in the unsteady state, the graph of the measurement result is the one obtained by translating the graph of the steady state by fv along the T1−T2 axis. Therefore, considering fv, when other factors are calculated in the same manner as in the calibration procedure in the steady state, the wafer temperature can be obtained. More specifically, a heat resistance R obtained by a subprocess constituting a process and with a different temperature state (e.g., steady, rise, or drop), and fv are stored in a data processing unit 6 in advance. When measuring the wafer temperature, T2 and q measured by the heat flux microsensor 4, and R and fv corresponding to a corresponding subprocess are substituted in equation (4), so that the wafer temperature T1 can be calculated.

In the above description, a semiconductor wafer such as a silicon wafer is used as a target substrate. Obviously, the present invention can also be applied to, e.g., an LCD (Liquid Crystal Device) substrate, a glass substrate, a printed substrate, and the like. The present invention can also be applied to baking after resist coating, and baking as a pre-process of ion implantation, CVD, etching, or ashing. The present invention is not limited to a baking apparatus, but can be applied to other thermal processing apparatuses such as a film forming apparatus or an ashing apparatus. As the means for heating the wafer, a lamp, a heater, or other means may be employed.

As has been described above, according to the present invention, when a heat flux and temperature at one position are measured, the temperature of a target substrate arranged away from the sensor can be measured easily. Since the emissivity is not measured, an expensive radiation thermometer need not be used unlike in the conventional case. Therefore, a temperature measuring apparatus and a semiconductor processing apparatus using it can be provided at a low cost.

What is claimed is:

1. A semiconductor processing apparatus comprising:

heating means for heating a target substrate;

a sensor for measuring a temperature of the target substrate to be thermally processed by said heating means;

control means for controlling said heating means on the basis of the temperature of the substrate;

wherein said sensor includes:

heat flux detecting means for detecting a heat flux supplied from at least part of the target substrate; and temperature measuring means for measuring a temperature of said sensor; and calculating means for calculating the temperature of the target substrate from a thermal resistance, said heat flux, and the temperature of said sensor, wherein the thermal resistance is obtained from an upper surface temperature of said target substrate, said sensor temperature, and said heat flux under the predetermined process condition; and storage means for storing each thermal resistance obtained from said target substrate upper surface temperature, said sensor temperature and said heat flux under a plurality of different process conditions, and wherein said calculating means measures the temperature of said target substrate for each of the plurality of different process conditions based upon the thermal resistance corresponding to a current process condition read out from said storage means; and wherein the target substrate is thermally processed under the predetermined process condition.

2. An apparatus according to claim 1, wherein said sensor is arranged opposite to said heating means, through the target substrate, which heats the target substrate.

3. An apparatus according to claim 1, wherein the thermal resistance is obtained in advance by calibration.

4. An apparatus according to claim 2, wherein the thermal resistance is obtained in advance by calibration.

* * * * *